United States Patent
Osada et al.

(10) Patent No.: US 9,603,231 B2
(45) Date of Patent: Mar. 21, 2017

(54) PROCESSING APPARATUS

(71) Applicant: CANON ANELVA CORPORATION, Kawasaki (JP)

(72) Inventors: Tomoaki Osada, Fuchu (JP); Masami Hasegawa, Kunitachi (JP)

(73) Assignee: Canon Anelva Corporation, Kawasaki-shi (JP)

( * ) Notice: Subject to any disclaimer, the term of this patent is extended or adjusted under 35 U.S.C. 154(b) by 636 days.

(21) Appl. No.: 14/030,003

(22) Filed: Sep. 18, 2013

(65) Prior Publication Data
US 2014/0014269 A1    Jan. 16, 2014

Related U.S. Application Data

(63) Continuation of application No. PCT/JP2012/001572, filed on Mar. 7, 2012.

(30) Foreign Application Priority Data

Apr. 4, 2011 (JP) .................. 2011-083113

(51) Int. Cl.
C23C 16/00 (2006.01)
C23F 1/00 (2006.01)
(Continued)

(52) U.S. Cl.
CPC ........... H05H 1/00 (2013.01); H01J 37/3244 (2013.01); H01J 37/32082 (2013.01);
(Continued)

(58) Field of Classification Search
USPC ............. 118/715, 723 ME, 723 IR, 723 ER; 156/345.33, 345.35
See application file for complete search history.

(56) References Cited

U.S. PATENT DOCUMENTS 6,080,287 A    6/2000 Drewery et al.
6,197,165 B1    3/2001 Drewery et al.
(Continued)

FOREIGN PATENT DOCUMENTS

CN    1425187 A    6/2003
CN    101123178 A    2/2008
(Continued)

OTHER PUBLICATIONS

Chinese Office Action in corresponding Chinese Application No. 201280015592.3 dated Apr. 23, 2015 (14 pages including English translation).
(Continued)

*Primary Examiner* — Rakesh Dhingra
(74) *Attorney, Agent, or Firm* — Fitzpatrick, Cella, Harper & Scinto

(57) ABSTRACT

A processing apparatus includes a substrate supporting unit that supports a substrate in a processing space in which the substrate is processed, a first partitioning member that includes a ceiling portion having an opening and partitions the processing space from an outer space, and a second partitioning member that is attached to the first partitioning member so as to close the opening and partition the processing space from the outer space together with the first partitioning member. The second partitioning member is attached to the first partitioning member so that the second partitioning member is removable from the first partitioning member by moving the second partitioning member toward a space which a lower surface of the ceiling portion faces.

10 Claims, 12 Drawing Sheets

(51) Int. Cl.
*H01L 21/306* (2006.01)
*H05H 1/00* (2006.01)
*H01L 21/67* (2006.01)
*H01J 37/32* (2006.01)

(52) U.S. Cl.
CPC .. *H01J 37/32431* (2013.01); *H01J 37/32458* (2013.01); *H01L 21/6719* (2013.01); *H01L 21/67069* (2013.01)

(56) References Cited

U.S. PATENT DOCUMENTS

| | | | |
|---|---|---|---|
| 6,287,435 | B1 | 9/2001 | Drewery et al. |
| 6,458,252 | B1 | 10/2002 | Russell |
| 6,719,886 | B2 | 4/2004 | Drewery et al. |
| 8,191,505 | B2 | 6/2012 | Kamaishi et al. |
| 2002/0104751 | A1 | 8/2002 | Drewery et al. |
| 2002/0179245 | A1 | 12/2002 | Masuda et al. |
| 2004/0108068 | A1* | 6/2004 | Senzaki ............ H01J 37/32458 156/345.43 |
| 2005/0193953 | A1 | 9/2005 | Makino et al. |
| 2006/0060141 | A1 | 3/2006 | Kamaishi et al. |
| 2007/0117397 | A1* | 5/2007 | Fu .................... H01J 37/32357 438/710 |
| 2008/0295872 | A1* | 12/2008 | Riker ................ H01J 37/32357 134/105 |
| 2009/0057269 | A1* | 3/2009 | Katz .................. H01J 37/3244 216/67 |
| 2014/0020833 | A1 | 1/2014 | Yoshida et al. |

FOREIGN PATENT DOCUMENTS

| | | |
|---|---|---|
| CN | 101615570 A | 12/2009 |
| CN | 201517131 U | 6/2010 |
| EP | 1489643 A2 | 5/1999 |
| JP | 6-310436 A | 11/1994 |
| JP | 10-149899 A | 6/1998 |
| JP | 2000-269183 A | 9/2000 |
| JP | 2000-269199 A | 9/2000 |
| JP | 2003-514126 A | 4/2003 |
| JP | 2004-235545 A | 8/2004 |
| JP | 2008-182218 A | 8/2008 |
| WO | 00/60653 A1 | 10/2000 |
| WO | 01/37310 A2 | 5/2001 |

OTHER PUBLICATIONS

Office Action issued in Taiwanese Patent Application No. 101110817, dated Jul. 7, 2014 (4 pages).

* cited by examiner

PROCESSING APPARATUS

This application is a continuation of International Patent Application No. PCT/JP2012/001572 filed on Mar. 7, 2012, and claims priority to Japanese Patent Application No. 2011-083113 filed on Apr. 4, 2011, the entire content of both of which is incorporated herein by reference.

BACKGROUND OF THE INVENTION

Field of the Invention

The present invention relates to a processing apparatus that processes a substrate.

Description of the Related Art

An inductively coupled plasma processing apparatus is known in which antennas are arranged around a bell jar. Japanese Patent Laid-Open No. 2004-235545 discloses a plasma processing apparatus in which a vacuum processing chamber is formed by a vacuum container (2) and a bell jar (12) that closes the top of the vacuum container (2). Here, a gas ring (4) is disposed on a flange (24) of the vacuum container (2) via an O-ring, and the bell jar (12) is mounted on the gas ring (4) via an O-ring. Antennas (1a, 1b) are arranged around the bell jar (12), and a high-frequency power supply (10) is connected to the antennas (1a, 1b) via a matching device (matching box) (3).

In processing apparatuses such as inductively coupled plasma processing apparatuses, during processing (for example, deposition processing, etching processing) of substrates, a reaction product accumulates on an inner surface of a bell jar. The reaction product that has accumulated on the inner surface of the bell jar may peel off and fall on a substrate or a substrate supporting unit. Moreover, if the amount of the reaction product that accumulates on the inner surface of the bell jar increases, the conditions under which substrates are processed may change accordingly. To address these issues, a maintenance operation may be performed in which the bell jar is removed from a processing apparatus, cleaned, and attached again to the processing apparatus, or the bell jar is replaced.

However, like the processing apparatus disclosed in Japanese Patent Laid-Open No. 2004-235545, in cases of processing apparatuses having a configuration in which the bell jar is mounted on a structure (vacuum container) that is situated under the bell jar, in order to remove the bell jar from the structure, it is necessary to remove a matching device and the like disposed on an upper side of the bell jar beforehand. If the matching device is removed and attached again to the processing apparatus after the removal, cleaning, and attachment of the bell jar, the state of coupling of an antenna to plasma changes, and therefore it is necessary to set the conditions for processing such as deposition, etching, or the like over again. This setting of conditions takes a long period of time, resulting in a decrease in productivity. Thus, it should be avoided to remove the matching device from the processing apparatus every time the bell jar is to be cleaned or replaced.

SUMMARY OF THE INVENTION

The present invention provides a technology that is advantageous for improving the productivity.

One of aspects of the invention relates to a processing apparatus that processes a substrate. The processing apparatus includes a substrate supporting unit that supports a substrate in a processing space in which the substrate is processed, a first partitioning member that includes a ceiling portion having an opening and partitions the processing space from an outer space, and a second partitioning member that is attached to the first partitioning member so as to close the opening and partition the processing space from the outer space together with the first partitioning member. The second partitioning member is attached to the first partitioning member so that the second partitioning member is removable from the first partitioning member by moving the second partitioning member toward a space which a lower surface of the ceiling portion faces.

Further features and advantages of the present invention will become apparent from the following description with reference to the attached drawings. It should be noted that in the attached drawings, the same or similar components are denoted by the same reference numerals.

BRIEF DESCRIPTION OF THE DRAWINGS

The attached drawings, which are included in the description and constitute a part thereof, illustrate embodiments of the present invention and are used to explain the principle of the present invention in conjunction with the description of the embodiments.

DESCRIPTION OF THE EMBODIMENTS

Figure 1:
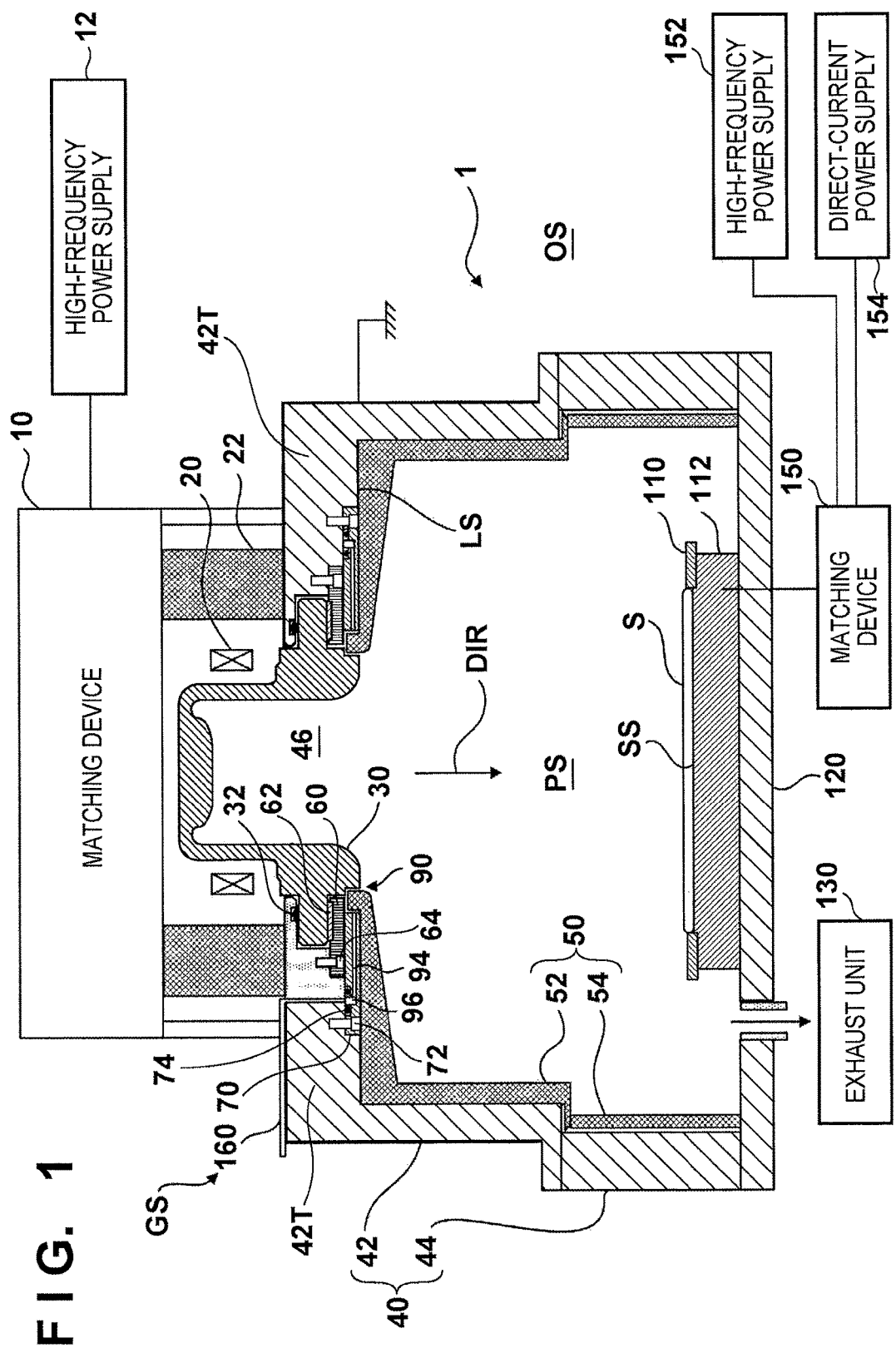
FIG. 1 is a cross-sectional view schematically showing the configuration of a processing apparatus according to an embodiment of the present invention.

A processing apparatus 1 of an embodiment of the present invention will be described with reference to FIG. 1. The processing apparatus 1 may typically be configured as an inductively coupled plasma processing apparatus. However, the present invention is also applicable to other processing apparatuses such as, for example, an ECR plasma processing apparatus, a microwave plasma processing apparatus, and the like. The processing apparatus 1 includes a first partitioning member (chamber) 40, a second partitioning member (bell jar) 30, and a base unit 120, which serve as a member (enclosure) that partitions a processing space PS in which a substrate S is processed from an outer space (e.g., atmospheric environment) OS.

The first partitioning member 40 may include, for example, an upper partitioning member 42 and a lower partitioning member 44 as at least two members that can be separated from each other. The first partitioning member 40 or the upper partitioning member 42 includes a ceiling portion 42T that has an opening 46. The second partitioning member 30 is attached to the first partitioning member 40 so as to close the opening 46 and partition the processing space PS from the outer space OS together with the first partitioning member 40.

The second partitioning member 30 is attached to the first partitioning member 40 so that the second partitioning member 30 is removable from the first partitioning member 40 by moving the second partitioning member 30 toward a space (in the state in FIG. 1, the processing space PS) which the lower surface LS of the ceiling portion 42T faces (i.e., toward direction DIR). Here, the direction DIR is the direction which the lower surface LS of the ceiling portion 42T of the first partitioning member 40 or the upper partitioning member 42 faces. Therefore, the direction DIR is a direction that depends on the orientation of the first partitioning member 40 or the upper partitioning member 42 (i.e., relative direction with respect to the first partitioning member 40 or the upper partitioning member 42), and is not an absolute direction based on a reference surface such as a horizontal surface.

The base unit 120 may be disposed so as to close an opening in a lower portion of the first partitioning member 40. However, the base unit 120 may also be integrated into the first partitioning member 40 so as to constitute a part of the first partitioning member 40.

Figure 2:
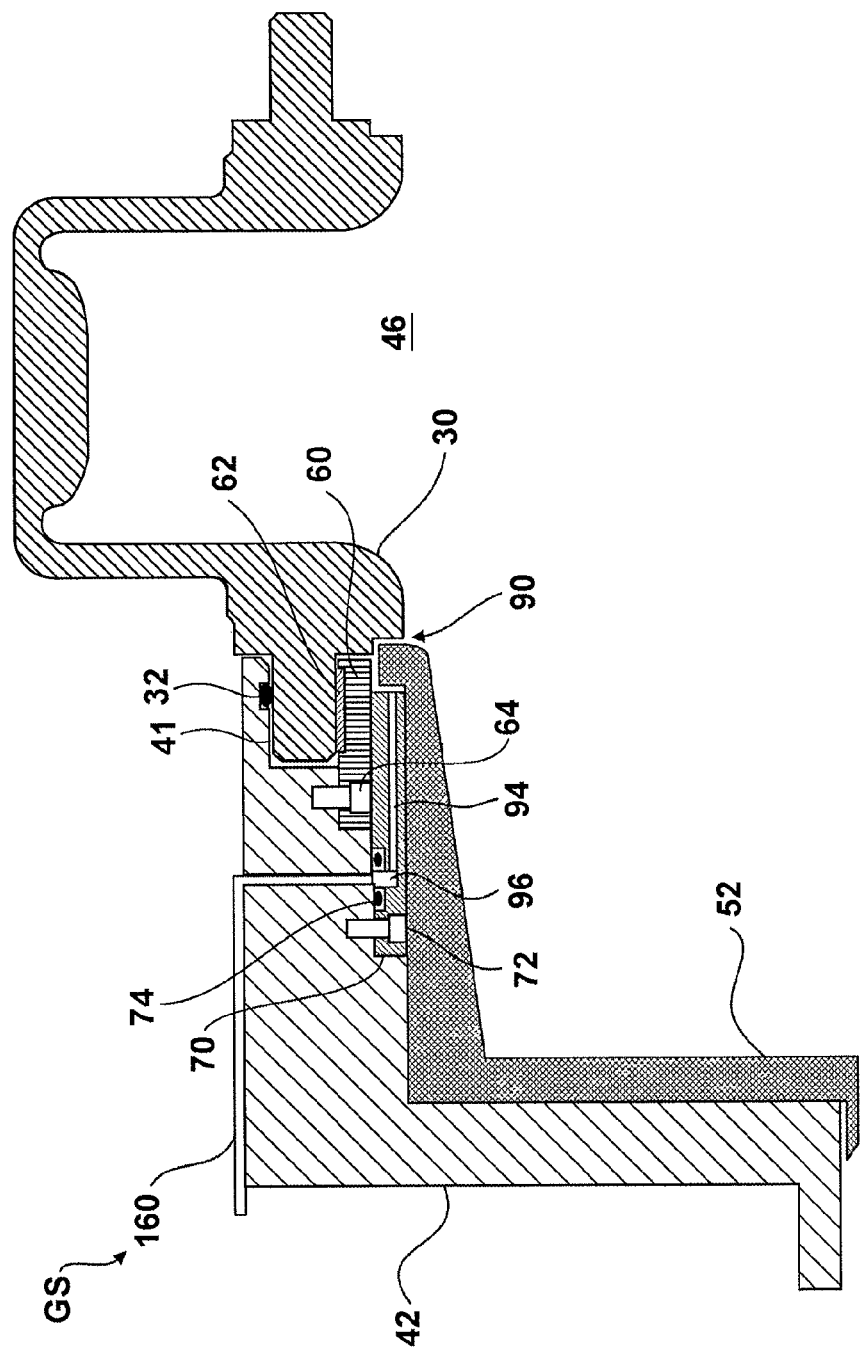
FIG. 2 is a partial enlarged view of the processing apparatus shown in FIG. 1.

As exemplified in FIG. 2, the first partitioning member 40 or the upper partitioning member 42 may have an attachment surface 41 around the opening 46. The second partitioning member 30 may be attached to the first partitioning member 40 or the upper partitioning member 42 so that the second partitioning member 30 is pressed against the attachment surface 41 via a seal member (e.g., an O-ring) 32. More specifically, a pressing ring 60 is fastened to the upper partitioning member 42 by a fastening member (e.g., a bolt) 64, and the pressing ring 60 thus presses the second partitioning member 30 against the attachment surface 41 via the seal member (e.g., an O-ring) 32. Here, it is preferable that the pressing ring 60 has an elastic ring 62 and applies a pressing force to the second partitioning member 30 via the elastic ring 62. This is effective in preventing the second partitioning member 30 from being damaged due to pressing. Moreover, providing the elastic ring 62 is more effective from the standpoint of preventing the second partitioning member 30 from being damaged due to an external pressure that is applied to the second partitioning member 30 from the outer space OS when the processing space PS is under vacuum. Preferably, the elastic ring 62 is composed of a material having elasticity and also being resistant to plasma, resistant to active gas, and resistant to heat, and for example, it is preferable that the elastic ring 62 is composed of Teflon (registered trademark). It should be noted that although it is preferable that the elastic ring 62 is composed of a single ring-shaped member from the standpoint of reducing the number of components, the elastic ring 62 may also be composed of, for example, a plurality of ring-shaped members, or may be composed of sheet-shaped members that are circumferentially arranged at regular intervals. Moreover, although it is preferable that the pressing ring 60 is composed of a metal in view of the heat resistance and rigidity, the pressing ring 60 may also be composed of a member that has elasticity, and in that case the pressing ring 60 need not have the elastic ring 62.

The configuration in which the second partitioning member 30 is pressed against the attachment surface 41, which faces downward, via the seal member (e.g., an O-ring) 32 is excellent in that sealing can be achieved by a single seal member 32.

The processing apparatus 1 includes a gas supply unit GS and an antenna 20. The antenna 20, which is disposed in the outer space OS so as to be in close proximity to the second partitioning member 30, supplies an electromagnetic wave to gas that is supplied into the processing space PS by the gas supply unit GS, thereby exciting the gas. A high-frequency power is supplied to the antenna 20 from a high-frequency power supply (RF power supply) 12 via a matching device 10. An electromagnet unit 22 for diffusing the plasma, which is generated in a space inside the second partitioning member 30 by the electromagnetic wave radiated from the antenna 20, toward the substrate S may be disposed on the outside of the antenna 20. In order to introduce the electromagnetic wave radiated from the antenna 20 into the space inside the second partitioning member 30 and generate plasma, the second partitioning member 30 is composed of an insulating material such as, for example, quartz glass, aluminum nitride, or the like.

The processing apparatus 1 may further include a shield 50 that is disposed inside the first partitioning member 40 (the upper partitioning member 42 and the lower partitioning member 44) so as to face the processing space PS and protects the first partitioning member 40 against the plasma environment in the processing space PS. The shield 50 may include, for example, an upper shield 52 that is disposed inside the upper partitioning member 42 and protects the upper partitioning member 42 against the plasma environment in the processing space PS and a lower shield 54 that is disposed inside the lower partitioning member 44 and protects the lower partitioning member 44 against the plasma environment in the processing space PS. The upper shield 52 may be fastened to the upper partitioning member 42 by a fastening member, which is not shown.

Figure 3:
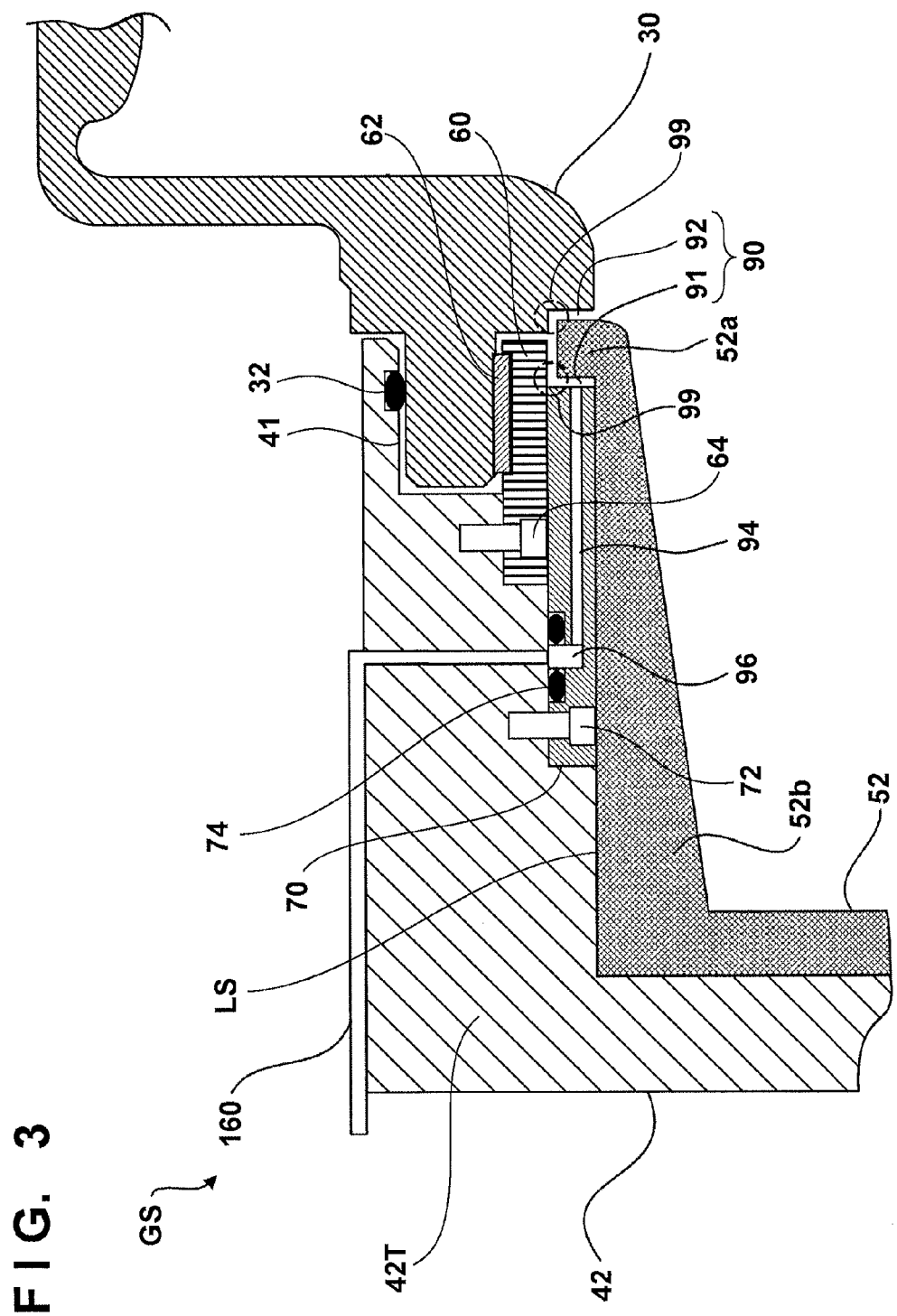
FIG. 3 is a partial enlarged view of the processing apparatus shown in FIG. 1.

As exemplified in FIG. 3, the gas supply unit GS may include, for example, an annular gas passage 90 for supplying gas into the processing space PS, a gas supply ring 70 that supplies the gas to the annular gas passage 90, and a gas supply passage 160 that supplies the gas to the gas supply ring 70. An outlet 92 of the annular gas passage 90 to the processing space PS is an annular slit. The gas that is supplied to the annular gas passage 90 via the gas supply passage 160 and the gas supply ring 70 is supplied through the annular gas passage 90 into the processing space PS as an annular gas stream. Since the outlet 92 of the annular gas passage 90 to the processing space PS is an annular slit, the gas can be more uniformly supplied into the processing space PS than in the case of a configuration in which the gas is supplied into the processing space PS directly from radially arranged gas supply holes. This means that the substrate S can be more uniformly processed, or the distance (distance that is required to diffuse the gas to make the gas uniform) between the second partitioning member (bell jar) 30 and the substrate S can be reduced.

At least a part of the annular gas passage 90 may be defined by the second partitioning member 30 and the upper shield 52. For example, the outlet (annular slit) 92 of the annular gas passage 90 to the processing space PS may be defined by a gap between an outer side surface of a lowest portion of the second partitioning member (bell jar) 30 and an innermost side surface of the upper shield 52. This provides an advantage in maintenance. That is, the outlet (annular slit) 92 is cleaned by merely cleaning the second partitioning member 30 and the upper shield 52. Moreover, gas supply holes 94 are not directly exposed to plasma, and therefore contamination and aged deterioration of the gas supply holes 94 can be reduced. On the other hand, in cleaning of conventional gas supply holes, it is necessary to clean even an interior (that is, a portion that is not exposed to the surface) of the gas supply holes. This is disadvantageous in terms of the reliability of cleaning and in terms of the time that is required for cleaning.

In addition, an inlet 91 of the annular gas passage 90 may be defined by a gap between an inner side surface of the gas supply ring 70 and an outer side surface of a passage defining portion 52a of the upper shield 52, and at least a part of a portion between the inlet 91 and the outlet 92 of the annular gas passage 90 may be defined by a gap between a lower surface of the pressing ring 60 and an upper surface of the passage defining portion 52a of the upper shield 52. The upper shield 52 includes a ceiling shield portion 52b that comes into contact with the lower surface LS of the ceiling portion 42T of the upper partitioning member 42, and the passage defining portion 52a of the upper shield 52 may be, for example, a portion protruding upward from the ceiling shield portion 52b. In this embodiment, the annular gas passage 90 is defined by the pressing ring 60, the gas supply ring 70, the second partitioning member 30, and the shield 50 (upper shield 52).

The gas supply ring 70 may include, for example, an annular diffusing channel 96 that annularly diffuses the gas supplied from the gas supply passage 160, and the gas supply holes 94 that connect the annular diffusing channel 96 to the inlet 91 of the annular gas passage 90. The gas supply ring 70 may be fastened to the upper partitioning member 42 of the first partitioning member 40 by a fastening member (e.g., a bolt) 72. In a cross section cut along a plane containing a normal to a substrate mounting surface SS of the substrate supporting unit 112 (FIG. 3 shows this cross section), the annular gas passage 90 may include at least one bent portion 99 between the inlet 91 and the outlet 92 of the annular gas passage 90. This is effective in increasing the length of a path from the inlet 91 to the outlet 92 of the annular gas passage 90 and uniformly diffusing the gas. This consequently contributes to uniform processing of the substrate S. At this time, it is possible to more uniformly supply the gas into the processing space PS by arranging the gas supply holes 94 at equal intervals on the circumference of the gas supply ring 70.

The gas supply ring 70 may be attached to the upper partitioning member 42 so that the fastening member 64 for fastening the pressing ring 60 to the upper partitioning member 42 is concealed by the gas supply ring 70. In other words, the pressing ring 60 is sandwiched by the upper partitioning member 42 and the gas supply ring 70. Seal members (e.g., O-rings) 74 may be disposed between the gas supply ring 70 and the upper partitioning member 42 so as to be respectively positioned outside and inside the annular diffusing channel 96. The seal members 74 prevent the gas that is supplied from the gas supply passage 160 from leaking into a gap between the gas supply ring 70 and the upper partitioning member 42, and thus can improve diffusion of the gas in the annular diffusing channel 96.

The processing apparatus 1 includes the substrate supporting unit 112 that supports the substrate S in the processing space PS. The substrate supporting unit 112 is supported by the base unit 120. The substrate supporting unit 112 may include a peripheral ring 110 that is disposed so as to surround the substrate S and the substrate mounting surface SS. An exhaust port is provided in the base unit 120, and the gas in the processing space PS is exhausted by an exhaust unit 130 through the exhaust port. An exhaust baffle and the like are used between the processing space PS and the exhaust unit 130. The substrate supporting unit 112 includes electrodes for electrostatically adsorbing the substrate S and biasing the substrate S, and the electrodes are connected to a high-frequency power supply 152 and a direct-current power supply 154 via a matching device 150.

Figure 4:
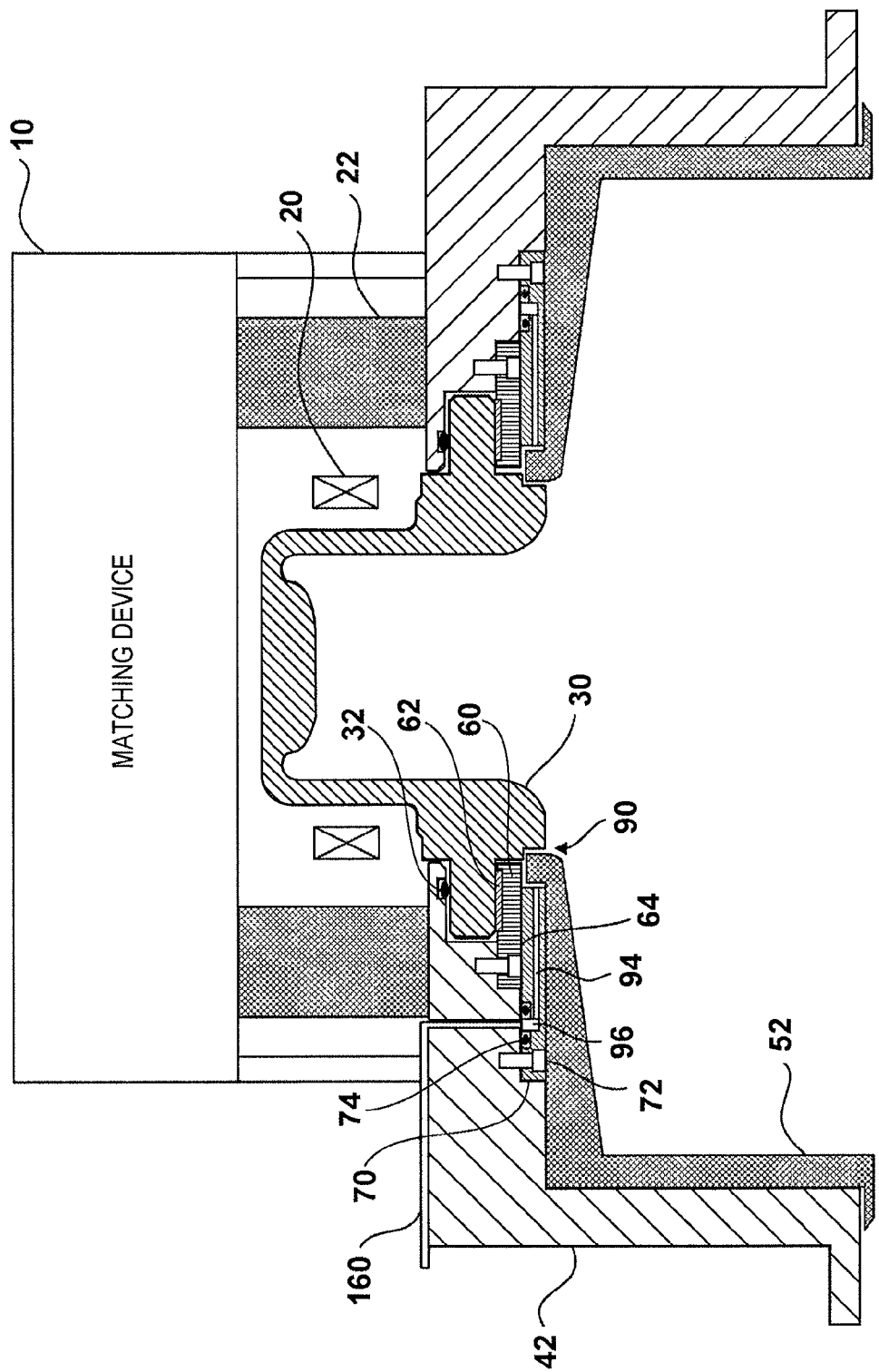
FIG. 4 is a partial enlarged view of the processing apparatus shown in FIG. 1.
Figure 5:
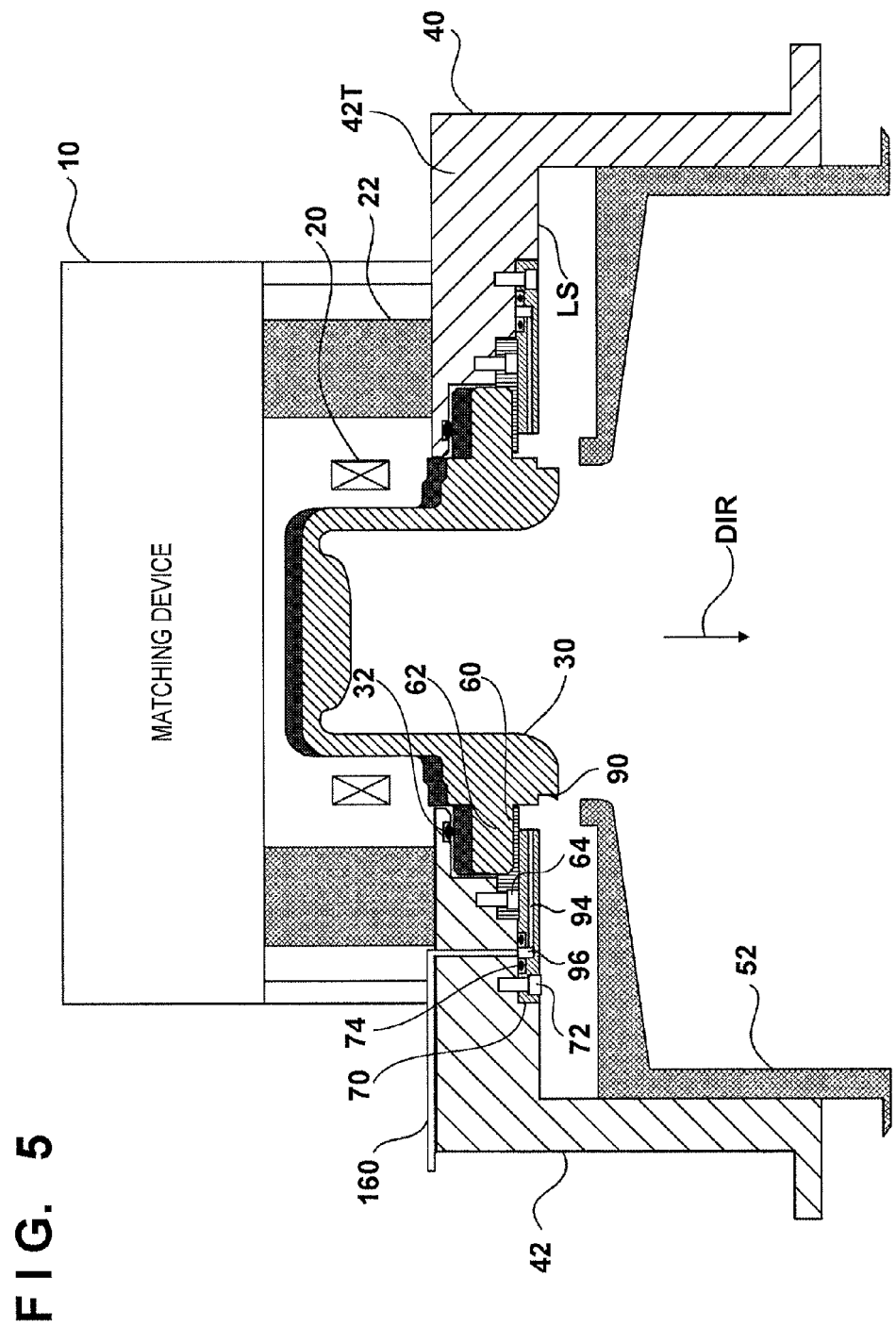
FIG. 5 is a partial enlarged view of the processing apparatus shown in FIG. 1.

Hereinafter, removal and attachment of the second partitioning member (bell jar) 30 will be described with reference to FIGS. 4 to 8, which are partial enlarged views of the processing apparatus 1 shown in FIG. 1. FIG. 4 shows, for illustrative purposes, a state before an operation for removing the second partitioning member 30 is performed. First, as shown in FIG. 5, the upper shield 52 is removed from the upper partitioning member 42 by moving the upper shield 52. Here, the direction in which the upper shield 52 is moved is the direction DIR toward the space which the lower surface LS of the ceiling portion 42T faces. It should be noted that although the direction DIR toward the space which the lower surface LS faces is a downward direction in FIG. 5, it is an upward direction in a state shown in FIG. 11, which will be described later.

Figure 6:
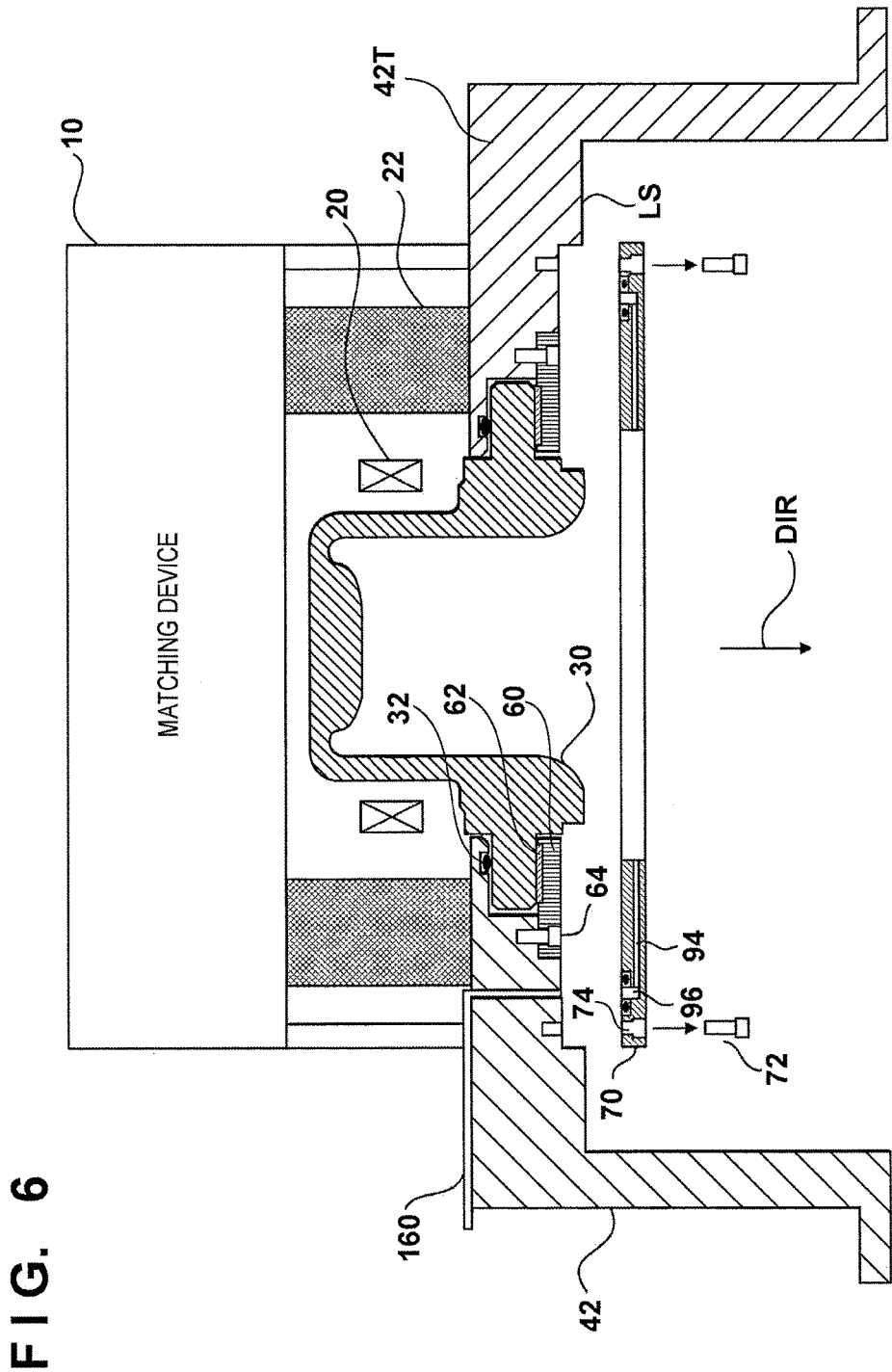
FIG. 6 is a partial enlarged view of the processing apparatus shown in FIG. 1.
Figure 7:
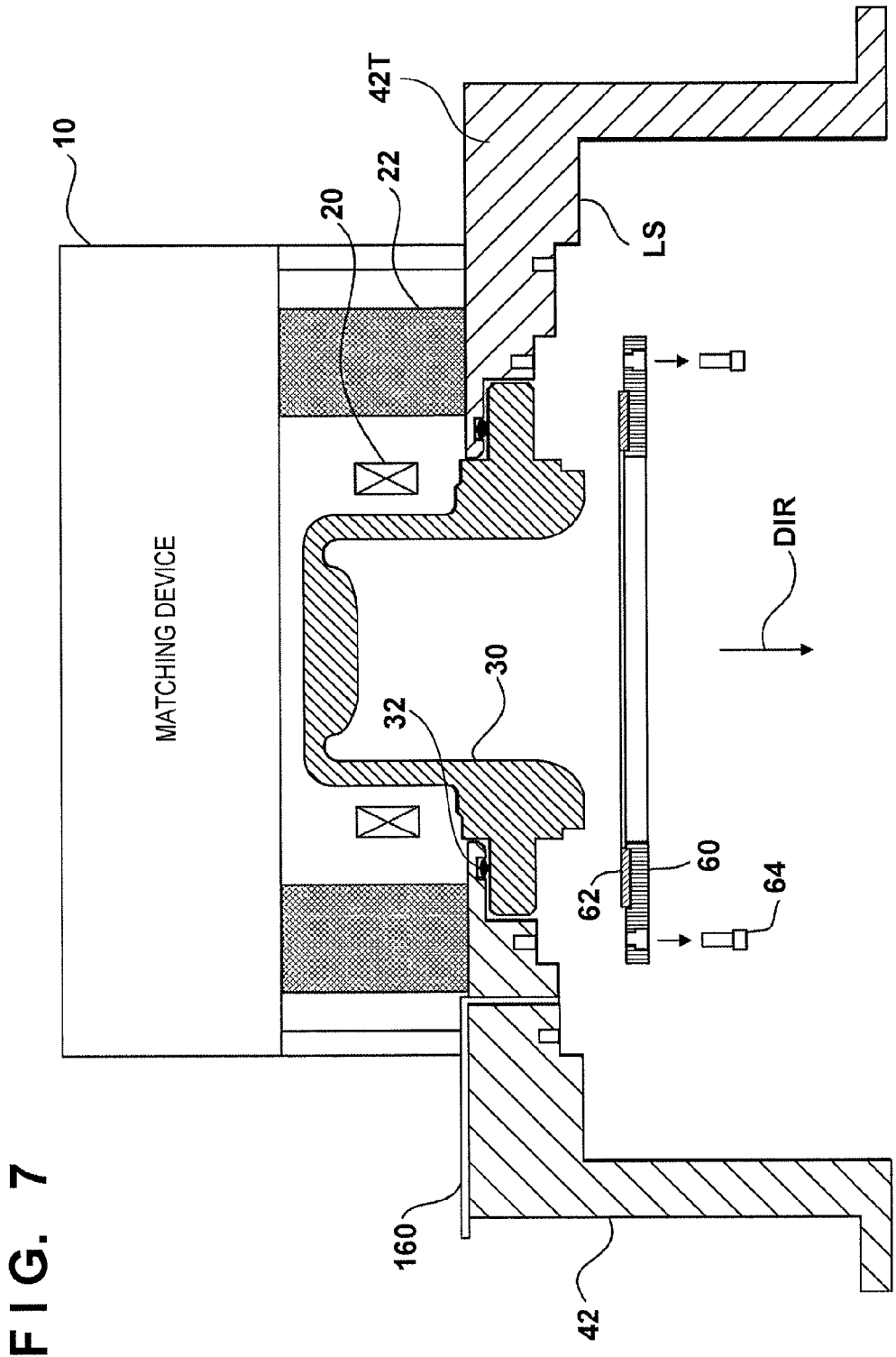
FIG. 7 is a partial enlarged view of the processing apparatus shown in FIG. 1.
Figure 8:
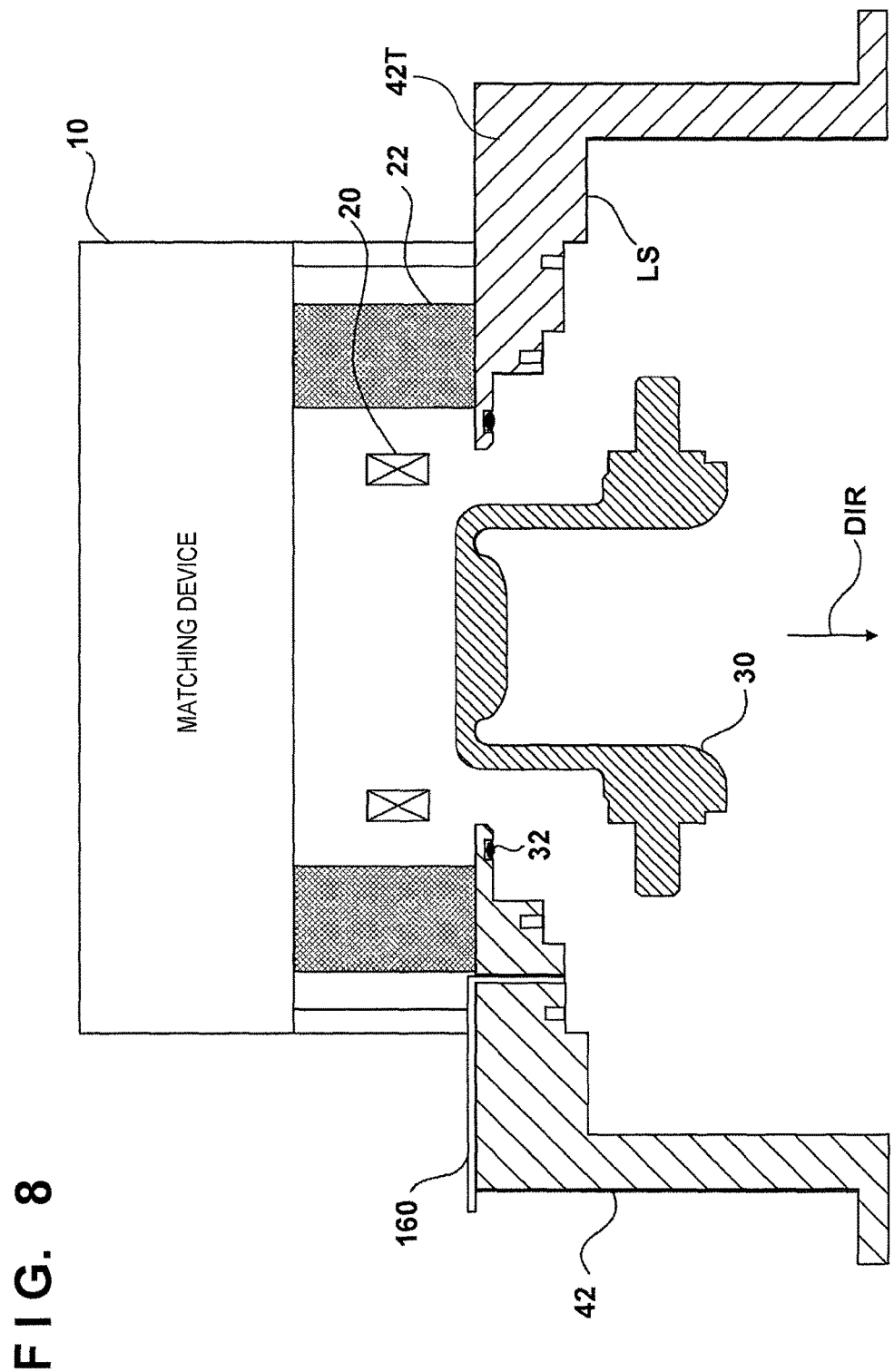
FIG. 8 is a partial enlarged view of the processing apparatus shown in FIG. 1.

Then, as shown in FIG. 6, the gas supply ring 70 is removed from the upper partitioning member 42 by releasing the fastening of the gas supply ring 70 to the upper partitioning member 42 by the fastening member 72 and moving the gas supply ring 70 in the direction DIR. Then, as shown in FIG. 7, the pressing ring 60 is removed from the upper partitioning member 42 by releasing the fastening of the pressing ring 60 to the upper partitioning member 42 by the fastening member 64 and moving the pressing ring 60 in the direction DIR. As a result, the second partitioning member 30 is in a state in which it can be removed from the upper partitioning member 42. Then, as shown in FIG. 8, the second partitioning member 30 is removed from the upper partitioning member 42 by moving the second partitioning member 30 in the direction DIR.

As described above, according to this embodiment, the second partitioning member (bell jar) 30 can be removed from the first partitioning member 40 or the upper partitioning member 42 and replaced without removing a structure that is situated above the second partitioning member (bell jar) 30, typically, the matching device 10, which may be a part of a structure ST, from the first partitioning member 40 or the upper partitioning member 42. Accordingly, when compared with an operation such as that of the aforementioned conventional technology, that is, an operation of removing the matching device 10 to remove the second partitioning member (bell jar) 30 and attaching the matching device 10 again to the processing apparatus 1 after the cleaned or another clean second partitioning member 30 is attached, the maintenance is facilitated, and the condition setting for the subsequent processing such as deposition, etching, or the like is facilitated.

In order to facilitate the operation of removing the second partitioning member 30 and then attaching the clean second partitioning member 30, the processing apparatus 1 may be configured so that the processing space PS can be opened to the outer space OS by separating at least the ceiling portion 42T (in this embodiment, the structure ST that includes the upper partitioning member 42 including the ceiling portion 42T and the second partitioning member 30) of the first partitioning member 40 from the base unit 120.

Figure 9:
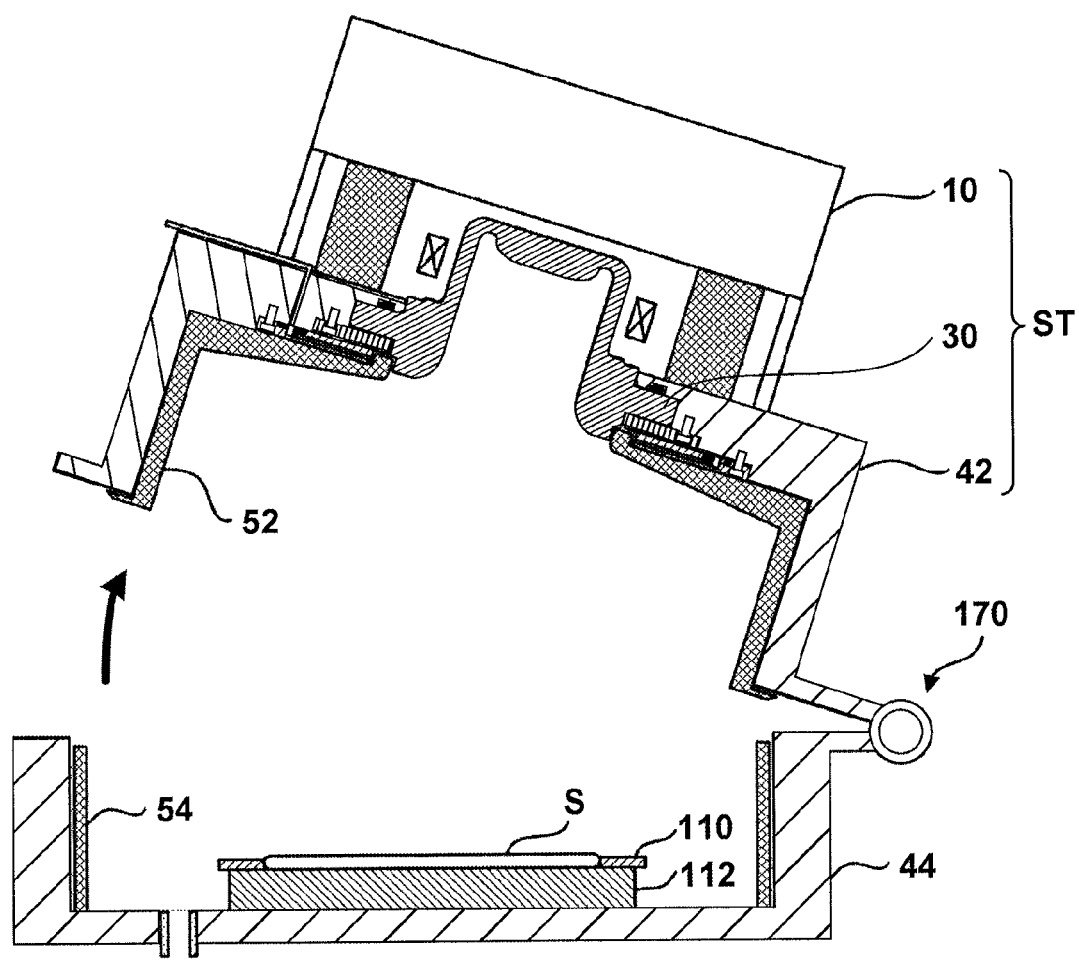
FIG. 9 is a diagram schematically showing an opening operation of the processing apparatus according to the embodiment of the present invention.
Figure 10:
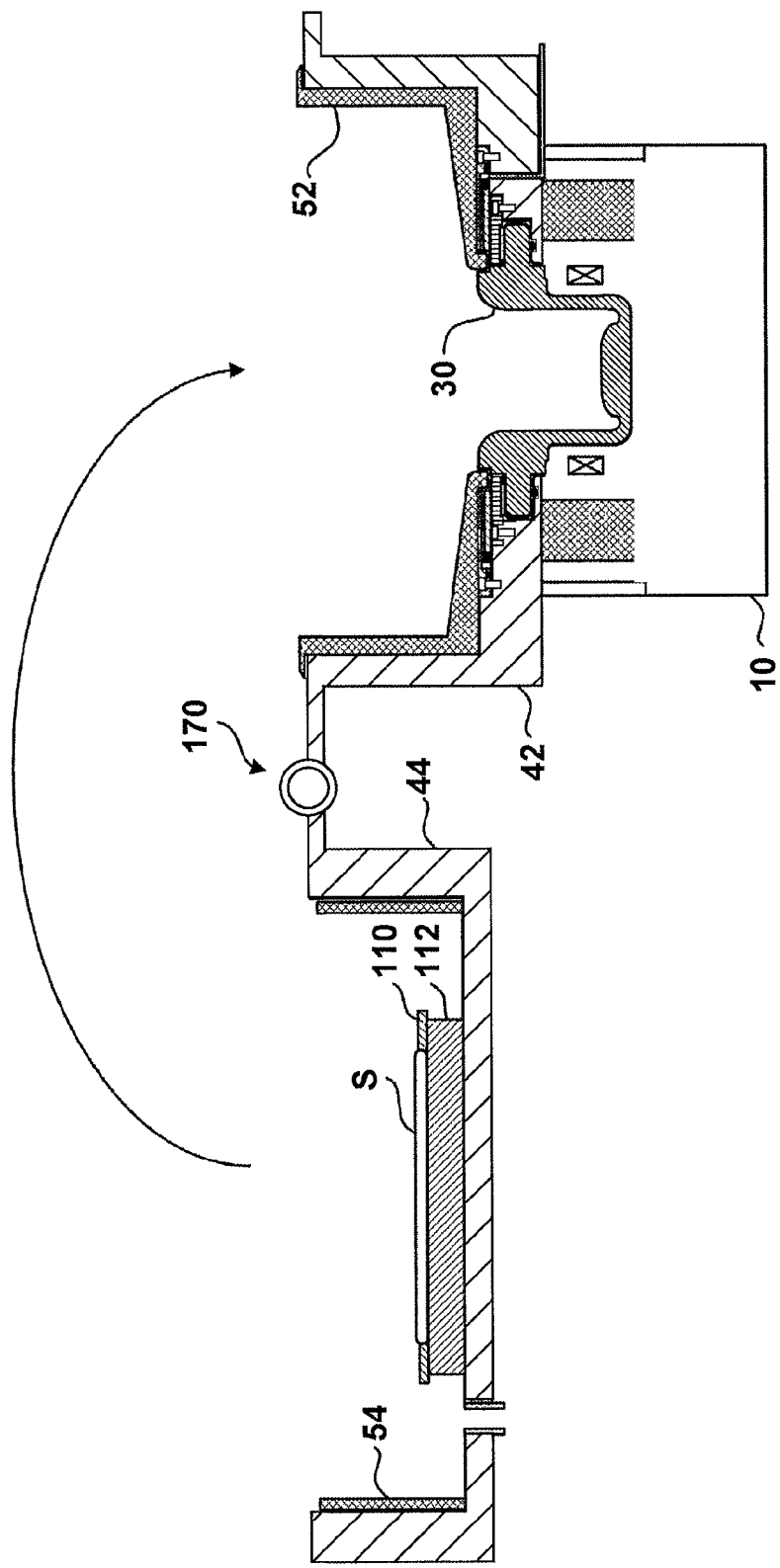
FIG. 10 is a diagram schematically showing an opening operation of the processing apparatus according to the embodiment of the present invention.
Figure 11:
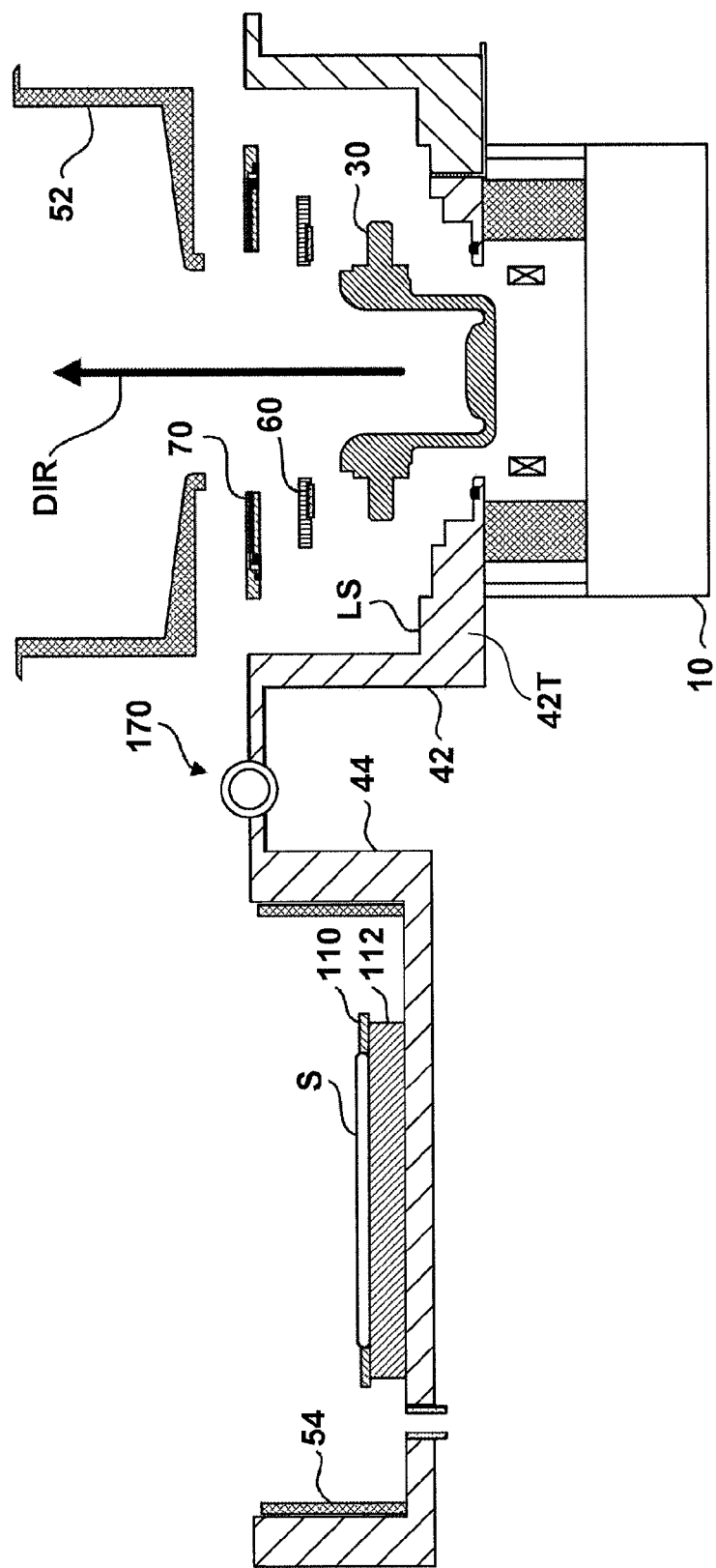
FIG. 11 is a diagram schematically showing a component removing operation of the processing apparatus according to the embodiment of the present invention.

FIGS. 9 to 11 show a mechanism for separating the structure ST from the lower partitioning member 44 as an example of a mechanism for separating the structure ST from the base unit 120. In the example shown in FIGS. 9 to 11, the structure ST and the lower partitioning member 44 are coupled to each other by a hinge unit 170, and the structure ST can be rotated relative to the lower partitioning member 44. The structure ST can be rotated 180 degrees as shown in FIGS. 9 and 10, the upper shield 52 and the gas supply ring 70 can be sequentially moved in the direction DIR and removed as shown in FIG. 11, and then the second partitioning member (bell jar) 30 can be moved in the direction DIR and thus removed. The configuration in which the structure ST is rotated 180 degrees as shown in FIGS. 9 to 11 is preferable from the standpoint of preventing the upper shield 52, the gas supply ring 70, and the second partitioning member (bell jar) 30 from falling during removal. Moreover, the angle is not limited to 180 degrees and can be set at any angle that can prevent falling. Instead of the configuration shown in FIGS. 9 to 11, a configuration in which, for example, the structure ST is moved upward may also be adopted.

Figure 12:
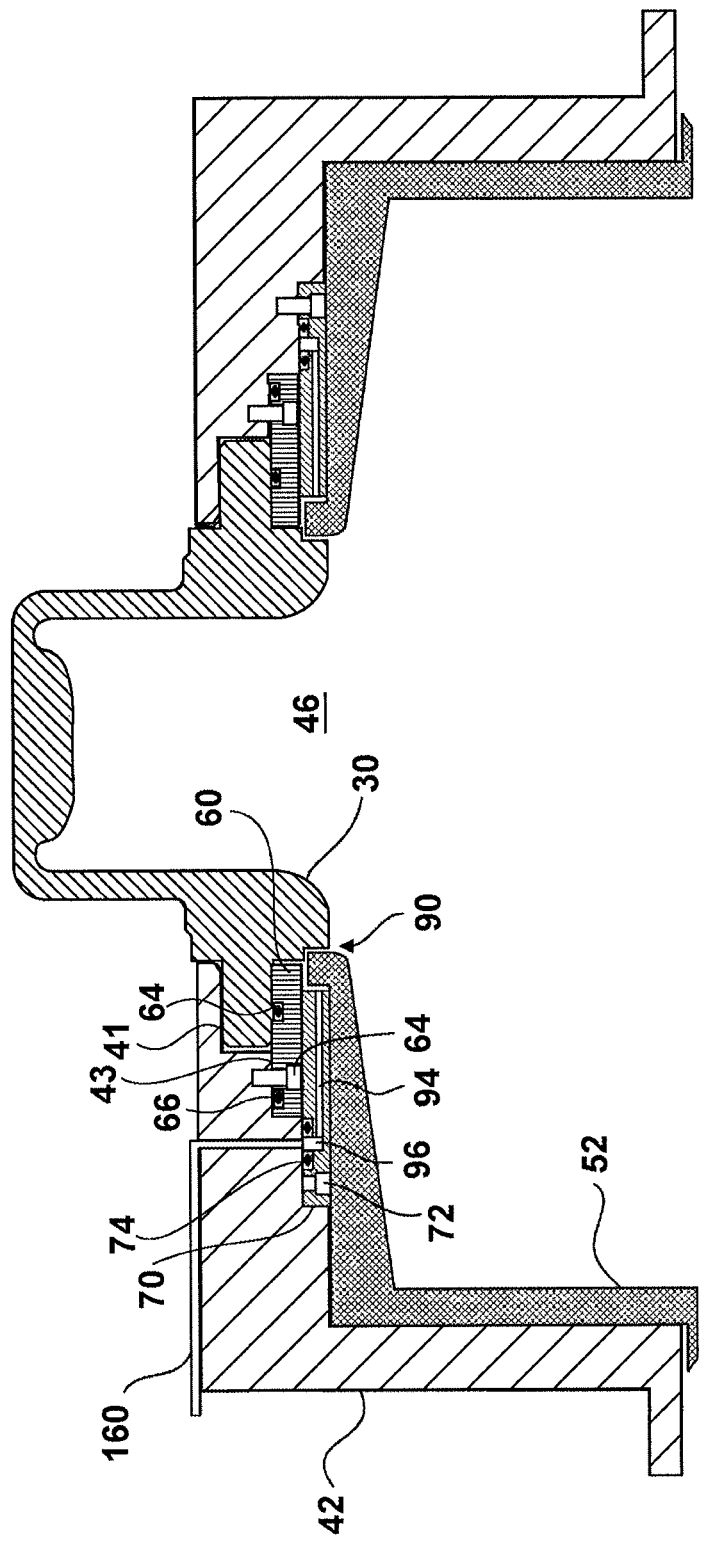
FIG. 12 is a cross-sectional view schematically showing the configuration of a processing apparatus according to another embodiment of the present invention.

FIG. 12 shows a variation of a sealing portion at a position where the first partitioning member 40 or the upper partitioning member 42 is connected to the second partitioning member 30. In the example shown in FIG. 12, the upper partitioning member 42 (first partitioning member 40) has the attachment surface 41 that is disposed around the opening 46 of the upper partitioning member 42 and a fixing surface 43 that is disposed around the attachment surface 41. The processing apparatus 1 includes the attachment ring 60 for pressing the second partitioning member 30 against the attachment surface 41. The attachment ring 60 is fixed to the fixing surface 43 of the upper partitioning member 42. A first seal member (e.g., an O-ring) 64 is disposed between the attachment ring 60 and the second partitioning member 30. A second seal member (e.g., an O-ring) 66 is disposed between the attachment ring 60 and the fixing surface 43 of the upper partitioning member 42. It should be noted that an elastic ring made of a material that has elasticity may also be disposed between the attachment surface 41 and the second partitioning member 30 from the standpoint of preventing damage to the second partitioning member 30.

The following is a description of a method for manufacturing a device such as a semiconductor device using the above-described processing apparatus 1. This device manufacturing method includes a step of loading the substrate S into the processing space PS of the processing apparatus 1 so that the substrate S is supported by the substrate supporting unit 112 and a step of supplying gas into the processing space PS by the gas supply unit GS, supplying an electromagnetic wave to the gas by the antenna 20 to excite the gas, and processing the substrate S with the thus generated plasma.

The present invention is not limited to the above-described embodiments, and various changes and modifications can be made within the spirit and scope of the present invention. Therefore, to apprise the public of the scope of the present invention, the following claims are made.

What is claimed is:

1. A processing apparatus that processes a substrate, the processing apparatus comprising:
    a substrate supporting unit that supports a substrate in a processing space in which the substrate is processed;
    a first partitioning member that includes a ceiling portion having an opening and partitions the processing space from an outer space;
    a second partitioning member that is attached to the first partitioning member so as to close the opening and partition the processing space from the outer space together with the first partitioning member; and
    a matching device attached to the first partitioning member and situated above the second partitioning member,
    wherein the first partitioning member has an attachment surface around the opening, the attachment surface facing a space which a lower surface of the ceiling portion faces,
    wherein the second partitioning member has a portion disposed underneath and facing the attachment surface from below the attachment surface, the second partitioning member being attached to the first partitioning member by attaching the portion of the second partitioning member from below to the attachment surface of the first partitioning member, and wherein
    the processing apparatus is configured so that the second partitioning member can be removed from the first partitioning member, without removing the matching device, by moving the second partitioning member toward the space.

2. The processing apparatus according to claim 1, wherein the second partitioning member is attached to the first partitioning member so that the portion of the second partitioning member is pressed against the attachment surface via a seal member.

3. The processing apparatus according to claim 2, further comprising:
    an attachment ring for pressing the portion of the second partitioning member against the attachment surface via the seal member.

4. The processing apparatus according to claim 3, wherein an elastic ring is disposed between the attachment ring and the portion of the second partitioning member.

5. The processing apparatus according to claim 1, wherein the first partitioning member has a fixing surface that is disposed around the attachment surface,
    the processing apparatus further comprises an attachment ring for pressing the portion of the second partitioning member, and
    the attachment ring is fixed to the fixing surface, a first seal member is disposed between the attachment ring and the second partitioning member, and a second seal member is disposed between the attachment ring and the fixing surface.

6. The processing apparatus according to claim 1, further comprising:
    an annular gas passage for supplying gas into the processing space; and
    a shield that is disposed inside the first partitioning member so as to face the processing space and protects the first partitioning member,
    wherein an outlet of the annular gas passage to the processing space is an annular slit, and the gas that is supplied to the annular gas passage is supplied into the processing space through the annular slit.

7. The processing apparatus according to claim 6, wherein at least a part of the annular gas passage is defined by the second partitioning member and the shield.

8. The processing apparatus according to claim 6, wherein the annular slit is defined by the second partitioning member and the shield.

9. The processing apparatus according to claim 6, further comprising:
    a gas supply ring that is fastened to the first partitioning member and supplies gas to the annular gas passage, wherein the gas supply ring is disposed so that the attachment ring is sandwiched by the first partitioning member and the gas supply ring, and the annular gas passage is defined by the attachment ring, the gas supply ring, the second partitioning member, and the shield.

10. The processing apparatus according to claim 1, further comprising:

a base unit that supports the substrate supporting unit, wherein the processing apparatus is configured so that the processing space can be opened to the outer space by separating a structure that includes at least the ceiling portion of the first partitioning unit and the second partitioning unit from the base unit.

* * * * *